(12) United States Patent
Powers et al.

(10) Patent No.: US 8,614,514 B1
(45) Date of Patent: Dec. 24, 2013

(54) MICRO-SPRING CHIP ATTACHMENT USING RIBBON BONDS

(71) Applicant: Palo Alto Research Center Incorporated, Palo Alto, CA (US)

(72) Inventors: Vernon Powers, Norcross, GA (US); Eugene M. Chow, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/802,402

(22) Filed: Mar. 13, 2013

(51) Int. Cl.
*H01L 23/48* (2006.01)
*H01L 23/52* (2006.01)
*H01L 29/40* (2006.01)

(52) U.S. Cl.
USPC ........... 257/784; 257/773; 257/778; 438/117; 438/666; 438/108

(58) Field of Classification Search
USPC .......... 257/734, 784, 773, 776, 778; 438/108, 438/117, 666, 584
See application file for complete search history.

(56) References Cited

U.S. PATENT DOCUMENTS

| | | | |
|---|---|---|---|
| 3,842,189 A | 10/1974 | Southgate | |
| 5,054,680 A | 10/1991 | Stockham | |
| 5,613,861 A | 3/1997 | Smith et al. | |
| 7,426,117 B2 | 9/2008 | Van Schuylenbergh et al. | |
| 8,179,692 B2* | 5/2012 | Ihara | 361/787 |
| 8,405,198 B2* | 3/2013 | Chua et al. | 257/692 |
| 2005/0270135 A1* | 12/2005 | Chua et al. | 336/192 |
| 2006/0197232 A1* | 9/2006 | Tay et al. | 257/779 |
| 2009/0140433 A1* | 6/2009 | Bloom et al. | 257/773 |
| 2010/0295164 A1 | 11/2010 | Chua et al. | |
| 2010/0295165 A1* | 11/2010 | Chua et al. | 257/692 |
| 2010/0327466 A1* | 12/2010 | Drost et al. | 257/785 |
| 2012/0088330 A1* | 4/2012 | Chua et al. | 438/107 |

* cited by examiner

*Primary Examiner* — S. V. Clark
(74) *Attorney, Agent, or Firm* — Bever, Hoffman & Harms, LLP; Patrick T. Bever

(57) ABSTRACT

Standard ribbon bonds are utilized as clamp-like mechanical fasteners to attach an IC die in a "flip-chip" orientation to a support structure (e.g., a package base substrate or printed circuit board). Electrical connections between the support structure and the IC die are achieved by curved micro-springs that extend through an air-gap region separating the upper structure surface and the active surface of the IC die. The micro-springs have an anchor portion fixedly attached to one of the support structure and the IC die, and a free (tip) end that is in nonattached contact with an associated contact pad disposed on the other of the support structure and the IC die. Once the IC die is placed on the support structure, the ribbon bonds are formed between the support structure and the IC die using conventional wedge bonder, but the ribbon bonds connected to the non-active surface of the IC die.

20 Claims, 4 Drawing Sheets

MICRO-SPRING CHIP ATTACHMENT USING RIBBON BONDS

FIELD OF THE INVENTION

This invention relates to integrated circuits, and is particularly applicable to integrated circuit die/substrate assemblies, and to method for mounting integrated circuit dies on support substrates, for example, to produce in packaged semiconductor devices.

BACKGROUND OF THE INVENTION

A semiconductor package is a metal, plastic, glass, or ceramic casing containing one or more semiconductor electronic components typically referred to as integrated circuit (IC) die. Individual discrete IC components are formed using known semiconductor fabrication techniques (e.g., CMOS) on silicon wafers, the wafers are then cut (diced) to form individual IC die, and then the IC die are the assembled in a package (e.g., mounted on a package base substrate). The package provides protection against impact and corrosion, holds the contact pins or leads which are used to connect from external circuits to the device, and dissipates heat produced in the IC die.

A micro-spring package is one type of semiconductor package in which electrical connections between the IC die and the package base substrate are provided by way of tiny curved spring metal fingers known as "micro-springs". Micro-springs are batch-fabricated on a host substrate (i.e., either the IC die or the package base substrate), for example, using stress-engineered thin films that are sputter-deposited with a built-in stress gradient, and then patterned to form individual flat micro-spring structures having narrow finger-like portions extending from associated base (anchor) portions. The narrow finger-like portions are then released from the host substrate (the anchor portion remains attached to the substrate), whereby the built-in stress causes the finger-like portions to bend (curl) out of the substrate plane with a designed radius of curvature, whereby the tip end of the resulting curved micro-spring is held away from the host substrate. The micro-spring package utilizes this structure to make contact between the host substrate (e.g., the IC die) and a corresponding package structure (e.g., the package base substrate) by mounting the IC die such that the tip ends of the micro-springs contact corresponding contact pads disposed on the corresponding package structure.

Current methods for securing IC dies to base substrates using micro-springs requires the use of adhesives or bulky custom mechanical clamps. Adhesives are avoided as much as possible in high reliability electronics packaging and military applications because of organic outgassing risks, which limit ultimate reliability.

Ribbon bonds are metal connectors utilized to provide electrical connections between IC die and support substrates in some semiconductor packaging applications that require high power and high frequency packaging connections. Similar to wire bonds, ribbon bonds are only applied to the front (active) side metal of an IC die, and are not used in flip-chip-type packaging arrangements (i.e., where the front/active IC die surface faces the support structure).

What is needed is a low-cost method for securing an IC die to a support structure using micro-springs that avoids the need for adhesives.

SUMMARY OF THE INVENTION

The present invention is directed to a low-cost method for securing (clamping) a device (e.g., an IC die) to a support structure (e.g., a printed circuit board (PCB) or a base substrate in a semiconductor package assembly) without the need for adhesives by utilizing micro-spring interconnect structures (micro-springs) to provide electrical connections between the device/support (e.g., with an IC die in a "flip-chip" orientation), and by utilizing conventional ribbon bonds to mechanically attach the peripheral edge of the device to the support structure. According to an aspect of the present invention, ribbon bonds are formed between the support structure and the non-active surface of the IC die such that the IC die is rigidly secured in an optimal position that reliably maintains electrical connections by way of the micro-springs. Normally ribbon bonds are only utilized to make electrical connections to contacts formed on the front (active) side of an IC die (i.e., ribbon bonds are not used in flip-chip arrangements). Therefore, the present invention utilizes ribbon bonds in a unique way that typically can only be mechanical in its functionality (i.e., the ribbon bonds only contact non-active surfaces of the IC die, although some electrical functionality may be implemented if non-standard contacts are provided on the usually non-active backside surface of a "flip-chip" IC die).

By combining the use of micro-springs and ribbon bonds to secure a flip-chip IC dies to a substrate, the present invention provides several advantages over conventional die attachment methods. First, the use of ribbon bonds provides a more reliable die attachment approach than that of adhesives because it eliminates the adhesive curing period, which is typically required after the IC die is placed, which often subjects the IC dies to elevated cure temperatures that can reduce production yields. Second, the present invention avoids out-gassing and bleeding of epoxy adhesives, which contain extractables that contaminate component bond site, thereby providing a die-attachment approach that meets high-reliability and military specifications. Moreover, the ribbon bonds facilitate additional shielding/grounding of the IC die, for example, by way of connection to ground potentials on the support structure. Moreover, the present invention provides a non-destructive packaging type that allows relatively easy multiple reworks of the same IC die (i.e., by cutting the ribbon bonds, the IC die can be lifted free of the support structure, tested/modified, and then re-attached using a new set of ribbon bonds). Yet another advantage of the present invention is that the required ribbon bonding process is performed by available standard microelectronic capital equipment, thereby providing a clean, low-cost package assembly process that minimizes operator training.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in semiconductor packaging and other semiconductor circuit assemblies. The following description is presented to enable one of ordinary skill in the art to make and use the invention as provided in the context of a particular application and its requirements. As used herein, directional terms such as "upper", "upwards", "lower", "downward", "front", "rear" and "side" are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
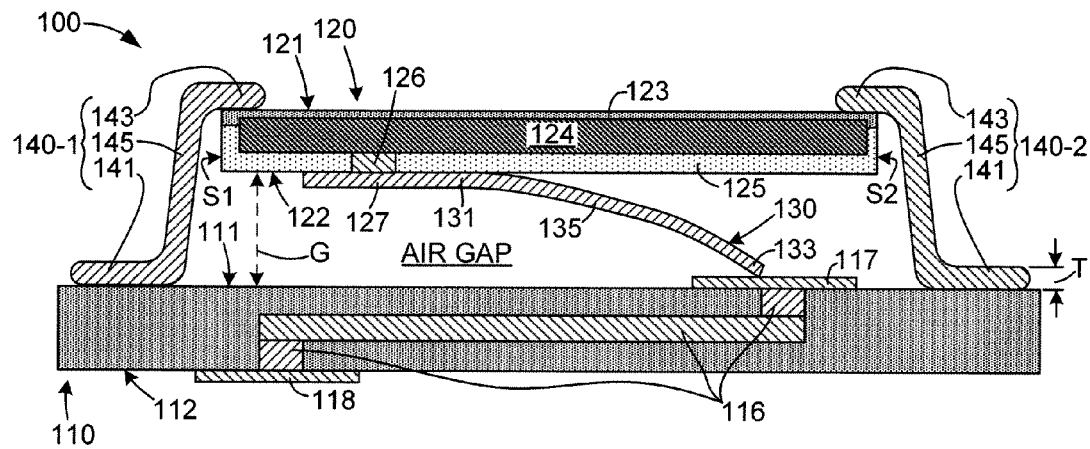
FIGS. 1(A) and 1(B) are cross-sectional side and top plan views showing an exemplary circuit assembly according to an embodiment of the present invention.
Figure 1B:
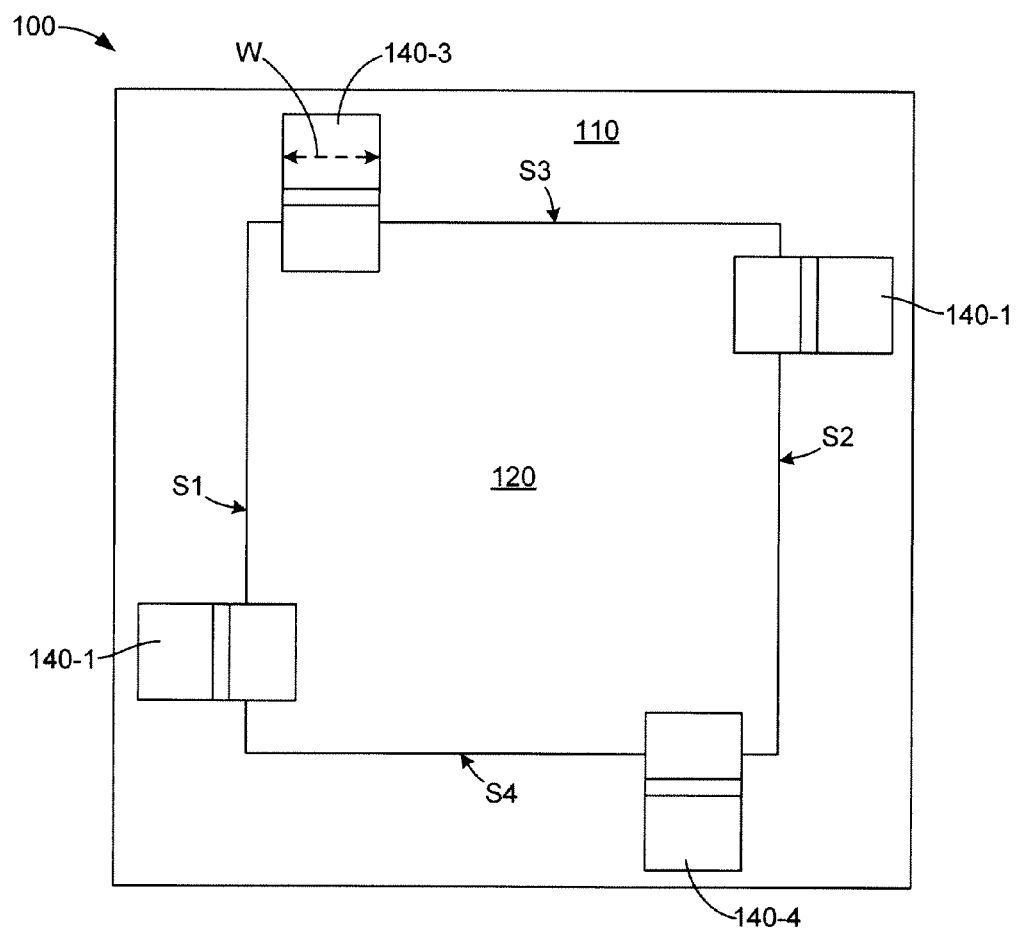

FIGS. 1(A) and 1(B) are cross-sectional side and top plan views showing a circuit assembly 100 according to a generalized and greatly simplified embodiment of the present invention. Circuit assembly 100 generally includes a support structure 110, an integrated circuit (IC) die 120, a curved micro-spring 130, and two ribbon bonds 140. Although only a single micro-spring 139 is shown and described as connecting IC die 120 to support structure 110 in order to simplify the following description, it is understood that, in practical applications, several tens of micro-springs are typically utilized to interconnect a functional support structure and an associated IC die, all of which being disposed and connected in the manner described below with reference to micro-spring 130.

Referring to the lower portion of FIG. 1, support structure 110 provides a base structure onto which IC die 120 is mounted, and includes an upper (first) contact pad 117 for making electrical connection to IC die 120 by way of micro-spring 130. In alternative embodiments, support structure 110 includes a printed circuit board (PCB) formed by any suitable package base substrate (e.g., sapphire, ceramic, glass, or organic board material) that operably facilitates the formation of conductive pathways for the transfer of electric signals to and from contact pad 117. For example, a signal path is established between upper contact pad 117 and a lower contact pad 118 disposed on lower surface 112 by way of internal conductor 116 (i.e., metal plugs/vias and metal traces formed in and between the layers non-conductive material), whereby support structure 110 is suitably configured for use as a package base substrate.

Referring to the upper portion of FIG. 1(A), IC die 120 is a semiconductor device including an integrated circuit 124 formed on one surface of a semiconductor (e.g., silicon) "chip" 123 using any known semiconductor fabrication technique (e.g., CMOS). In such devices a passivation layer 125 is typically formed over integrated circuit 124, with metal interconnect structures extending through passivation layer 125 to contact pads disposed on an external surface of IC die 120 (e.g., metal via 126 extends between integrated circuit 124 and contact pad 127 through passivation layer 125). Because standard semiconductor fabrication techniques typically involve processing performed entirely on one side of semiconductor chip 123 and typically conclude with passivation and metallization, all contact pads used to make electrical contact with integrated circuit 124 (e.g., contact pad 127) are disposed only on the outer surface of passivation layer 125, which is referred to as herein as "active" surface 122 of IC device 120. The opposing surface of IC die 120, which is the unprocessed side of semiconductor chip 123, is referred to as the "non-active" surface 121 because there are typically no conductive paths disposed between unprocessed surface 121 and integrated circuit 124.

According to an aspect of the present invention, IC die 120 is mounted on support structure 110 in a standard flip-chip orientation such that active surface 122 faces upper surface 111, and such that non-active surface 121 faces away from support structure 110. Note that the standard flip-chip orientation causes active surface 122 to become the lower (downward-facing) surface of IC die 120 in the finished assembly, with non-active surface 121 forming the upper (upward facing) surface of IC die 120.

According to another aspect of the present invention, IC die 120 is electrically connected to support structure 110 by way of a curved micro-spring 130 that is disposed in an air-gap region (AIR GAP) defined between active surface 122 and upper substrate surface 111. Curved micro-spring 130 is an integral structure having an anchor (first) end portion 131 that is fixedly connected to active surface 122 and is electrically connected to contact pad 127, a tip/free end (second portion 133 that is in nonattached contact (i.e., not attached by way of solder or other adhesive) with contact pad 117, and curved body portion 135 extending between the first and second ends through the air gap region. Micro-spring 130 is at least partially composed of a spring metal (e.g., molybdenum (Mo), a "moly-chrome" alloy (MoCr), tungsten (W), a titanium-tungsten alloy (Ti:W), chromium (Cr), copper (Cu), nickel (Ni) and a nickel-zirconium alloy (NiZr)), and is produced such that body portion 135 resiliently flexes when tip/free end abuts contact pad 127, thereby providing and maintaining a reliable electrical connection between IC die 120 and support substrate 110.

According to yet another aspect of the present invention, ribbon bonds 140-1 and 140-2 respectively include a horizontal lower (first) end portion 141 connected to upper surface 111 of support structure 110, a horizontal upper (second) end portion 143 connected to non-active surface 121 of IC die 120, and a vertical or diagonal body portion 145 extending between end portions 141 and 143, whereby IC die 120 mechanically secured to support structure 110. As used herein, the phrase "ribbon bond" refers to a metal (typically a noble metal, most typically gold) strap-like structure formed using commercially available wedge bonder equipment, but may also refer to any metal strap-like structure having a lateral width W that is greater than than its vertical thickness T. In an exemplary specific embodiment ribbon bonds 140-1 and 140-2 are standard strap-like gold structures having a thickness T of approximately 0.0005 in. or greater and a width W (shown in FIG. 1(B)) of approximately 0.005 in or greater.

FIG. 1(B) shows circuit assembly 100 in top view, and shows that IC die 120 is a four-sided (square) structure (i.e., IC die 120 has a substantially four-sided peripheral edge formed by a first side S1, a second side S2, a third side S3 and a fourth side S4. In the present embodiment IC die 120 is secured to support substrate 100 by four ribbon bonds 140-1 to 140-4. That is, as indicated in both FIGS. 1(A) and 1(B), (first) ribbon bond 140-1 extends over (first) side edge S1 between support structure 110 and non-active surface 122, and (second) ribbon bond 140-2 extends over (second) side edge S2 between support structure 110 and non-active surface 122. As indicated in FIG. 1(B), in a similar manner (third)

ribbon bond 140-3 extends over (third) side edge S3, and (fourth) ribbon bond 140-4 extends over fourth side edge S4. Ideally, since both IC die 120 and support structure 110 are low mass components, at a minimum four (0.005 in.×0.0005 in.) gold ribbon bond straps should be sufficient to meet the majority of environment and mechanical conditions while being of sufficient size to be compatible with most thin film layout rules. In other embodiments multiple ribbon bonds can be provided per chip side, but larger diameter ribbon bonds are presently preferred.

Figure 2A:
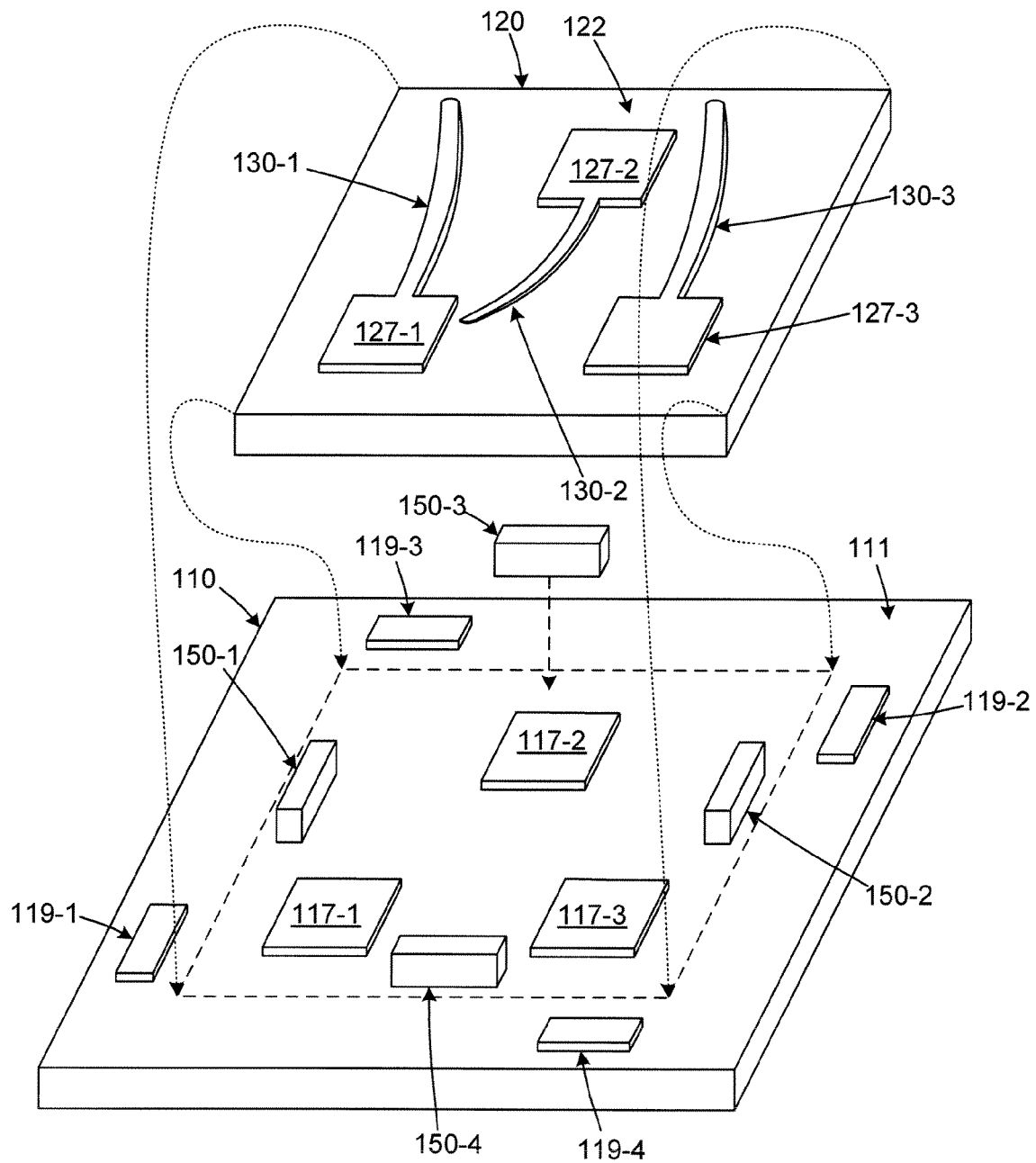
FIGS. 2(A), 2(B) and 2(C) are perspective views depicting an assembly method according to another embodiment of the present invention.
Figure 2B:
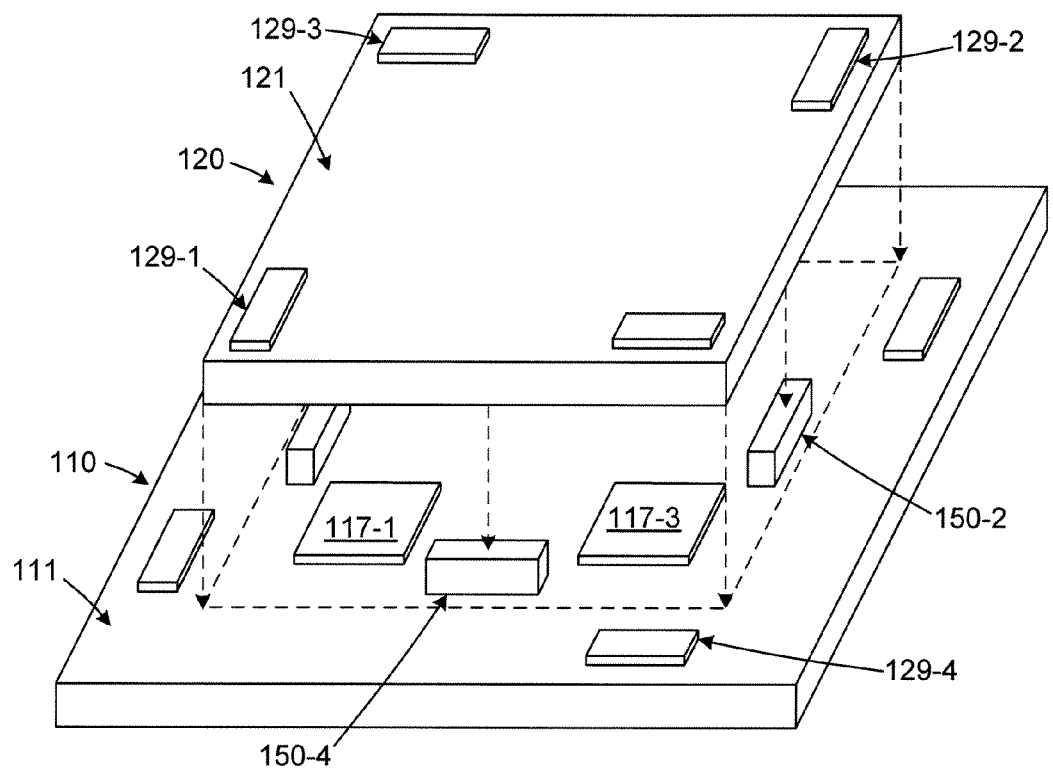
Figure 2C:
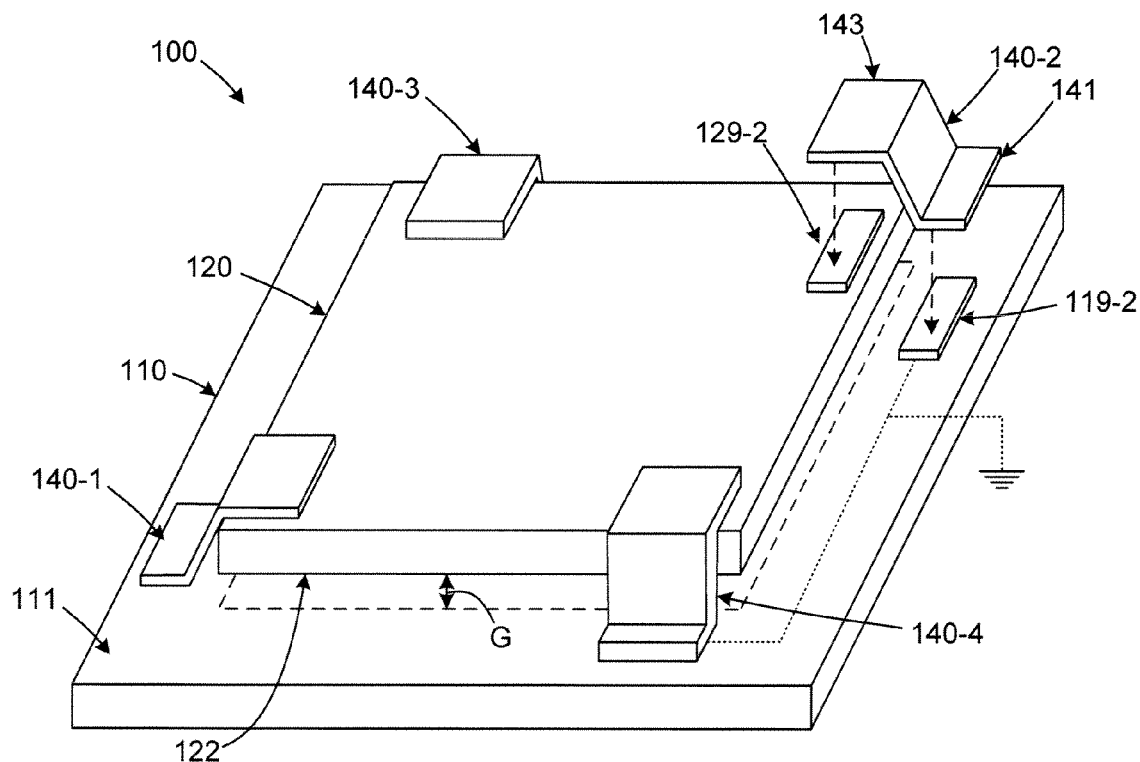

FIGS. 2(A) to 2(C) illustrate a basic package assembly process for producing circuit assembly 100 (FIG. 1) according to another embodiment of the present invention, and also illustrate additional features of and structures utilized by circuit assembly 100.

FIG. 2(A) shows IC die 120 disposed over support structure 110 with active surface 122 facing upward. IC die 120 includes three micro-springs 130-1, 130-2 and 130-3 that are formed on active surface 122 and released prior to assembly onto support structure 110. In one embodiment, micro-springs 130-1, 130-2 and 130-3 are formed using a self-bending spring metal that is deposited as a stress-engineered film that is then patterned to form spring material islands (flat structures) in which its lowermost portions (i.e., the deposited material adjacent to active surface 122) has a lower internal tensile stress than its upper portions (i.e., the horizontal layers located furthest from active surface 122), thereby causing the stress-engineered metal film to have internal stress variations that cause a narrow "finger" portion of the spring metal island to bend upward away from IC die 120 during the subsequent release process. Methods for generating such internal stress variations in stress-engineered metal films are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, a titanium (Ti) release material layer is deposited on active surface 122, then a stress-engineered metal film includes one or more of molybdenum (Mo), a "moly-chrome" alloy (MoCr), tungsten (W), a titanium-tungsten alloy (Ti:W), chromium (Cr), copper (Cu), nickel (Ni) and a nickel-zirconium alloy (NiZr) are either sputter deposited or plated over the release material. An optional passivation metal layer (not shown; e.g., gold (Au), platinum (Pt), palladium (Pd), or rhodium (Rh)) may be deposited on the upper surface of the stress-engineered metal film to act as a seed material for the subsequent plating process if the stress-engineered metal film does not serve as a good base metal. The passivation metal layer may also be provided to improve contact resistance in the completed spring structure. In an alternative embodiment, a nickel (Ni), copper (Cu) or nickel-zirconium (NiZr) film may be formed that can be directly plated without a seed layer. If electroless plating is used, the deposition of the electrode layer can be skipped. In yet another alternative embodiment, the self-bending spring material may be one or more of a bimorph/bimetallic compound (e.g., metal1/metal2, silicon/metal, silicon oxide/metal, silicon/silicon nitride) that are fabricated according to known techniques.

FIGS. 2(A) to 2(C) illustrate the assembly process performed after micro-springs 130-1 to 130-3 have been formed and released, and after fabrication of support structure 110 is completed. As indicated by the dashed-line arrows in FIG. 2(A) and in FIG. 2(B), IC die 120 is "flipped" (turned upside down) before mounting onto support structure 110, thereby aligning the tips of micro-springs 130-1, 130-2 and 130-3 to abut contact pads 117-1, 117-2 and 117-3, respectively, which are formed on upper surface 111 of support structure 110. Note that, as indicated in FIG. 1, offset gap distance G between active surface 122 and upper surface 111 is substantially defined by curved body portion 135 of each microspring 130, which extends diagonally through air gap region AIR GAP. As indicated in FIG. 2(C), IC die 120 is then mechanically attached to support structure 110 by way of ribbon bonds 140-1 to 140-4. The method presented above minimizes the use of adhesives and eliminates the need for other mechanical clamping structures to provide a packaging approach that is primarily inorganic, which is desirable in military, DoD and high-rel commercial applications. The method is performed using standard microelectronics equipment, and the only arguably non-standard piece of required equipment is a thermosonic ribbon/strap (flat wire) deep access wedge-wedge bonder that has sufficient power to weld gold ribbon bonds (width: >0.005 in.; thickness: >0.0005 in.).

The basic method described above may be modified, for example as set forth below, while remaining within the spirit and scope of the present invention.

According to a first alternative embodiment indicated in FIGS. 2(A) and 2(B), one or more stand-off structures 150-1 to 150-4 are disposed between IC die 120 and support structure 110 to set and maintain IC die 120 at an optimal offset gap distance G (shown in FIG. 2(C). Several non-out gassing materials can be used to form stand-off structures, as well as shims that can be removed after thermosonic wedge-wedge bonding. Package assembly utilizing custom tooling (i.e., removable shims) will make the bonding process easier. In one specific embodiment, stand-off structures 150-1 to 150-4 are etched polyimide pedestals.

Referring again to FIGS. 2(A) and 2(B), according to a second modification, support substrate 110 is further processed to include four (first) weld pads 119 on upper surface 111, and IC die 120 is further processed to include four (second) weld pads 129 on non-active surface 121. As indicated in FIG. 2(C), ribbon bonds 140-1 to 140-4 are secured to IC die 120 and support substrate 110 by way of thermosonic wedge-wedge ribbon bonding to these weld pads (e.g., such that end portion 141 of ribbon bond 140-1 is thermosonically welded to upper surface 111 by way of weld pad 119-1, and such that end portion 143 of ribbon bond 140-1 is thermosonically welded to non-active surface 121 by way of weld pad 129-1). These weld pads may be omitted in some cases (e.g., where one end of a ribbon bond-type strap is secured by way of a lead frame to one of the IC die or support substrate).

The strap-type ribbon bonds utilized in the present invention, besides providing superior mechanical integrity to the circuit assembly, also facilitate nondestructive reworking and enhanced shielding. That is, by disconnecting (cutting or lifting) the ribbon bonds at the second wedge bonds [do you mean lower, the IC die can be lifted off of support structure 110, tested and replace if bad. In addition, as indicated by the dotted lines in FIG. 2(C), by coupling ribbon bonds 150-1 to 150-4 to a ground source, another advantage provided by this packaging approach is that the ribbons can provide shielding for IC die 120.

Figure 3:
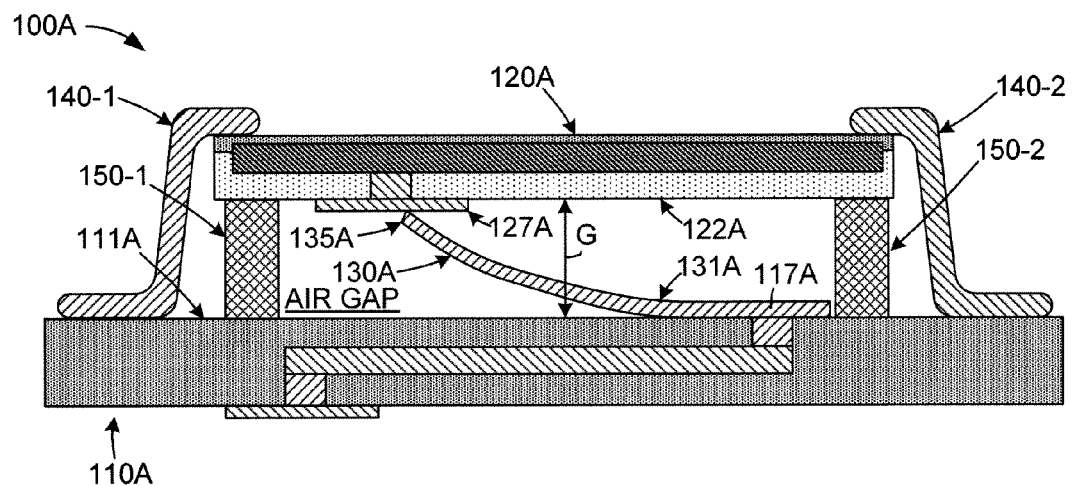
FIG. 3 is a cross-sectional side view showing an exemplary circuit assembly according to another embodiment of the present invention.

As described above, each micro-spring is an etched interconnect structure that attaches on one end to a carrier device (e.g., IC die 120 in the first embodiment) and on the other end to a mating device (e.g., support structure 110), and serves as an improvement on wirebonds or solder bumps (pin grid array, etc.) to provide interconnections between a chip package and a carrier/substrate/interconnect board. In alternative embodiments the role of host substrate for the micro-springs is performed by the support substrate. For example, as illustrated by circuit assembly 110A in FIG. 3, in an alternative embodiment micro-spring 130A is fabricated on substrate 110A (i.e., instead of on IC device 120A), whereby anchor end 131A of is fixedly attached to upper surface 111A, and tip end 133A is in nonattached contact with contact pad 127A. Note that FIG. 3 also shows stand-off structures 150-1 and 150-2 extending between upper surface 111A and active surface 122A, thereby maintaining the optimal air-gap distance G between substrate 110A and IC device 120A. Circuit assembly 100A is otherwise similar to the embodiments described above in that IC die 120A is secured to support substrate 110A by way of ribbon bonds 140-1 and 140-2.

Figure 4:
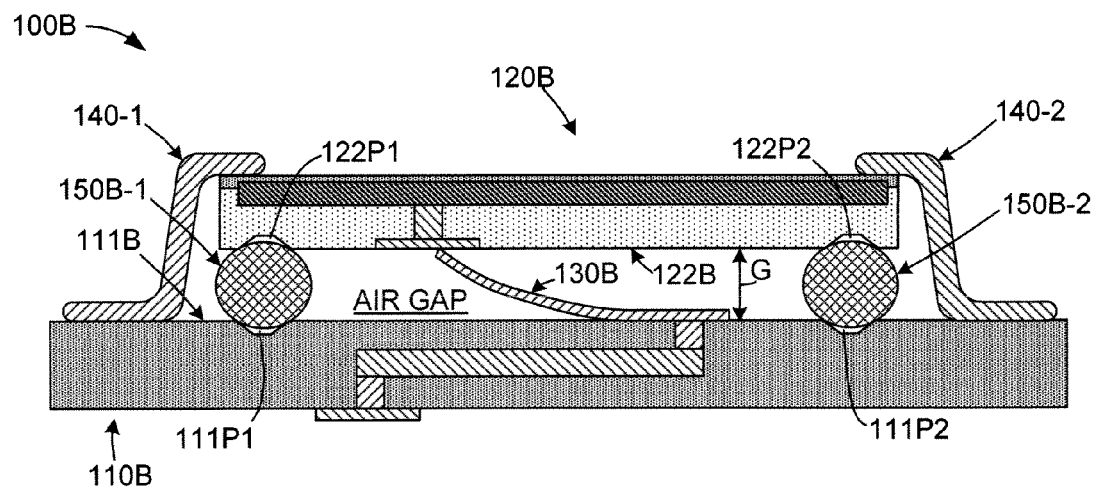
FIG. 4 is a cross-sectional side view showing an exemplary circuit assembly according to yet another embodiment of the present invention.

FIG. 4 shows another alternative embodiment in which circuit assembly 100B differs from the earlier embodiments in that pits 122P1 and 122P2 are defined in active surface 122B of IC die 120B, pits 111P1 and 111P2 are defined in upper surface 111B of support substrate 110B, and spacers 150B-1 and 150B-2 are implemented as spherical microball structures that are engaged in and held by pits 122P1/111P1 and 122P2/111P2, respectively. This arrangement simplifies assembly by providing predefined alignment structures that also serve to maintain the optimal air gap distance G between upper surface 111B and active surface 122B. Circuit assembly 100B is otherwise similar to the embodiments described above in that IC die 120B is secured to support substrate 110B by way of ribbon bonds 140-1 and 140-2.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with reference to the formation of ribbon bonds using conventional wedge bonder equipment, in another embodiment, the micro-spring carriers (i.e., the die/substrates on which the micro-springs are formed) are provided on a tape automated bonding (TAB) lead frame with ribbon bonds pre-attached (i.e. with one end of each ribbon bond already attached to the carrier, and with the second end of the ribbon bonds extending from the carrier in an optimal position for connection to the pad chip when the lead frame is mounted during assembly). In another alternative embodiment, depending on the intended use for the circuit assembly, non-noble ribbon bond materials may be used. Moreover, ultrasonic bonding and resistance welding are alternate welding techniques for attaching large ribbon bonds. Further, although described with reference to the formation of a semiconductor package-type structure, the assembly method described herein may be utilized to secure one or more of multiple IC dies in a multi-level packaging arrangement or IC devices (i.e., packaged IC dies) to large PCBs in system-level settings.

The invention claimed is:

1. A circuit assembly comprising:
   a support structure including a first contact pad disposed on an upper surface thereof, said first contact pad being electrically connected to at least one conductor disposed on said support structure;
   an integrated circuit (IC) device mounted on the support structure such that a non-active surface of the IC device faces away from the support structure, and an active surface of the IC device faces the upper surface of the support structure, the IC device including a second contact pad that is disposed on the active surface and is electrically connected to at least one conductive structure disposed on said IC device;
   a curved micro-spring disposed in an air gap region defined between the upper surface of the support structure and the active surface of the IC device, the micro-spring including a first end that is electrically connected to the second contact pad, a second end that is electrically connected to the first contact pad, and a curved body portion extending between the first and second ends; and
   a plurality of ribbon bonds, each said ribbon bond having a first end portion connected to the upper surface of the support structure, a second end portion connected to the second surface of the IC device, and a body portion extending between the first and second end portions, whereby the IC device is mechanically secured to the support structure by said ribbon bonds.

2. The circuit assembly according to claim 1, wherein the support structure comprises one of silicon, sapphire, ceramic, glass, or organic board material.

3. The circuit assembly according to claim 1, wherein the IC device comprises an IC die including a semiconductor chip having a processed surface and an opposing unprocessed surface, said at least one conductive structure being disposed on the processed surface, said IC die further including a passivation layer formed on said semiconductor chip over said at least one conductive structure, wherein said non-active surface is defined by the unprocessed surface of the IC die, and wherein the active surface is define by an outer surface of the passivation layer.

4. The circuit assembly according to claim 1, wherein each of the plurality of ribbon bonds comprises a noble metal strap-like structure having a width and a thickness, wherein the width is larger than the thickness.

5. The circuit assembly according to claim 1, wherein said micro-spring comprises one of molybdenum (Mo), molybdenum-chromium (MoCr) alloy, tungsten (W), a titanium-tungsten alloy (Ti:W), chromium (Cr), copper (Cu), nickel (Ni) and nickel-zirconium alloy (NiZr)).

6. The circuit assembly according to claim 1, wherein the first end of said micro-spring is fixedly attached to the active surface of the IC device, and the second end of said micro-spring is in nonattached contact with said first contact pad.

7. The circuit assembly according to claim 1,
   wherein said IC device comprises a substantially four-sided peripheral edge formed by first, second, third and fourth side edges, and
   wherein the plurality of ribbon bonds includes a first ribbon bond extending over the first side edge between said support structure and said non-active surface, a second ribbon bond extending over the second side edge between said support structure and said non-active surface, a third ribbon bond extending over the third side edge between said support structure and said non-active surface, and a fourth ribbon bond extending over the fourth side edge between said support structure and said non-active surface.

8. The circuit assembly according to claim 1, further comprising a plurality of first weld pads and a plurality of second weld pads, each said first weld pad being disposed between the first end portion of an associated said ribbon bond and the upper surface of the support structure, and each said second weld pad being disposed between the second end portion of an associated said ribbon bond and the non-active surface of the IC device.

9. The circuit assembly according to claim 1, further comprising one or more stand-off structures extending between the active surface of the IC device and the upper surface of the support structure.

10. The circuit assembly according to claim 9, wherein each of the stand-off structures comprises a polyimide pedestal.

11. The circuit assembly according to claim 1, wherein the first end of said micro-spring is fixedly attached to the upper surface of the support structure, and the second end of said micro-spring is in nonattached contact with said second contact pad.

12. The circuit assembly according to claim 9, wherein each of the stand-off structures comprises a spherical microball disposed in a first pit defined in the active surface and a second pit defined in the upper surface of the support structure.

13. A packaged semiconductor device comprising:
a base substrate including a first contact pad disposed on an upper surface thereof;
an integrated circuit (IC) die having a non-active surface and an opposing active surface including a second contact pad, said second contact pad being electrically connected to an integrated circuit fabricated on said IC die;
a curved micro-spring disposed between the base substrate and the IC die such that a first end of the micro-spring is electrically connected to the first contact pad and a second end of the micro-spring is electrically connected to the second contact pad, wherein said micro-spring includes a curved body portion extending between the first and second ends such that an air gap region is defined between the upper surface of the base substrate and the active surface of the IC die; and
a plurality of ribbon bonds, each said ribbon bond having a first end portion connected to the upper surface of the base substrate, a second end portion connected to the second surface of the IC die, and a body portion extending between the first and second end portions, whereby the IC die is mechanically secured to the base substrate by said ribbon bonds.

14. A method for electrically and mechanically securing an integrated circuit (IC) device to a support structure, the support structure having a first contact pad disposed on an upper surface thereof, and the IC device having a non-active surface and an opposing active surface including a second contact pad, said second contact pad being electrically connected to an integrated circuit disposed on said IC device, the method comprising:
mounting the IC device onto the support structure such that a first end of a micro-spring is electrically connected to the first contact pad and a second end of the micro-spring is electrically connected to the second contact pad, and such that a curved body portion said micro-spring extending between the first and second ends is disposed in an air gap region defined between the upper surface of the base substrate and the active surface of the IC device; and
mechanically attaching the IC device to the support structure by way of a plurality of ribbon bonds.

15. The method of claim 14, wherein mechanically attaching the IC device to the support structure comprises welding a first end of each said ribbon bond to the upper surface of the base substrate and welding a second end of each said ribbon bond to the non-active surface of the IC device.

16. The method of claim 14, wherein the IC device comprises an IC die including a semiconductor chip having a processed surface and an opposing unprocessed surface, and wherein mechanically attaching the IC die to the support structure comprises welding the second end of each said ribbon bond to the unprocessed surface of the IC die.

17. The method of claim 14, wherein the first end of said micro-spring is fixedly attached to the active surface of the IC device, and wherein mounting the IC device comprises causing the second end of said micro-spring to make nonattached contact with said first contact pad.

18. The method of claim 14, wherein the first end of said micro-spring is fixedly attached to the upper surface of the support structure, and wherein mounting the IC device comprises causing the second end of said micro-spring to make nonattached contact with said second contact pad.

19. The method of claim 14, wherein the support structure includes a plurality of first weld pads disposed on the upper surface, wherein the IC device includes a plurality of second weld pads disposed on the non-active surface, and wherein mechanically attaching the IC device to the support structure comprises thermosonically welding a first end of each said ribbon bond to the upper surface of the base substrate by way of an associated said first weld pad and thermosonically welding a second end of each said ribbon bond to the non-active surface of the IC device by way of an associated said second weld pad.

20. The method of claim 14, further comprising disposing one or more stand-off structures between the active surface of the IC device and the upper surface of the support structure before performing said mechanically attaching.

* * * * *